(12) United States Patent
Ferrer et al.

(10) Patent No.: US 6,317,064 B1
(45) Date of Patent: Nov. 13, 2001

(54) DC OFFSET CORRECTION ADAPTABLE TO MULTIPLE REQUIREMENTS

(75) Inventors: Enrique Ferrer, Miami; James C. Goatley, Sunrise, both of FL (US); Keith A. Tilley, Round Rock, TX (US); Raul Salvi, Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,834

(22) Filed: Feb. 29, 2000

(51) Int. Cl.[7] .................................................. H03M 1/10
(52) U.S. Cl. .......................................... 341/118; 455/234.2
(58) Field of Search ........................... 341/118; 455/234.2

(56) References Cited

U.S. PATENT DOCUMENTS

| | | | |
|---|---|---|---|
| 4,653,117 | 3/1987 | Heck ..................................... | 455/209 |
| 5,079,526 | 1/1992 | Heck ..................................... | 332/127 |
| 5,483,691 | 1/1996 | Heck et al. .......................... | 455/234.2 |
| 5,584,059 | 12/1996 | Turney et al. ........................ | 455/126 |
| 5,617,473 | 4/1997 | Wietecha et al. ..................... | 379/399 |
| 5,789,974 | 8/1998 | Ferguson, Jr. et al. .................. | 330/2 |
| 5,877,645 | * 3/1999 | Comino et al. ....................... | 327/350 |
| 5,893,029 | 4/1999 | Bastani ................................ | 455/324 |
| 5,898,912 | * 4/1999 | Heck et al. .......................... | 455/234.2 |
| 6,006,079 | 12/1999 | Jaffee et al. .......................... | 455/310 |
| 6,166,668 | * 12/2000 | Bautista et al. ....................... | 341/118 |

* cited by examiner

*Primary Examiner*—Howard L. Williams
(74) *Attorney, Agent, or Firm*—Frank M. Scutch, III

(57) ABSTRACT

A DC offset correction method and apparatus. Several DC offset correction schemes including a digital binary search scheme (100), a digital slow averaging scheme (200) and an analog integration (50) scheme are provided. A controller (160) selects one or more of the correction schemes in accordance with the desired characteristics provided by each scheme.

20 Claims, 4 Drawing Sheets

DC OFFSET CORRECTION ADAPTABLE TO MULTIPLE REQUIREMENTS

CROSS REFERENCE TO RELATED DOCUMENTS

This application is related to patent application Ser. No. 09/515,286 by Tilley, et al., entitled "Method and Apparatus for Settling and Maintaining a DC Offset," which is a continuation-in-part application Ser. No. 09/290,564 filed Apr. 13, 1999, Tilley, et al., entitled "Method and Apparatus for Settling a DC Offset," and also related to patent applications Ser. No. 09/575,271 Charles R. Ruelke, entitled "DC Offset Correction Loop for Radio Receiver," and Ser. No. 09/515,843 by Tilley, et al., entitled "Enhanced DC Offset Correction Through Bandwidth and Clock Speed Selection," filed concurrently herewith, assigned to Motorola, Inc., and incorporated herein by reference.

TECHNICAL FIELD

This invention relates to techniques and apparatus for carrying out correction of DC offsets in electronic circuits. This invention is especially suitable for situations where multiple, possibly conflicting, requirements for offset correction are needed.

BACKGROUND OF THE INVENTION

Radio receivers, including direct conversion receivers and Zero IF (ZIF) receivers, as well as other types of electronic devices (e.g. radio transmitters) often require that a DC offset be corrected in order to permit proper operation of the device. When a DC offset is present, it can be amplified by direct coupled amplifiers, thereby distorting the signal being processed or even saturating the amplifiers' output at their supply limits, thus rendering the device inoperable. Therefore, DC offsets normally have to be corrected or compensated in some manner.

The requirements for such compensation vary depending upon the pplication. For example, in certain applications for DC offset correction, there is a requirement that the speed of settling the offset correction loop be very fast. For example, in GSM radio receivers, the DC offset correction circuit must be settled to within ±30 mV maximum total error within 400 µS at the output of the baseband filter. This is a very stringent requirement to be met. Once the circuit is settled, even small changes in DC offset can present problems such as saturation of the baseband signal path. Fortunately, in this environment there are times where it is guaranteed that no signal is present. This time can be advantageously utilized for correction of the offset.

For other systems, however, there may be no time where it can be guaranteed that a signal will not be present. For these systems, a different type of DC offset correction might be required.

For GSM and other Time Division Multiple Access (TDMA) formats, the requirements vary substantially. Moreover, the requirements are different for various forms of continuous transmission radio devices (e.g. traditional two-way radio devices which are not TDMA devices). With the advent of multiple format communication devices (e.g. the iDEN™ telephone transceiver produced by Motorola, Inc.), there is a need for a versatile form of DC offset correction which can be configured to a variety of requirements with the same basic circuit configuration.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
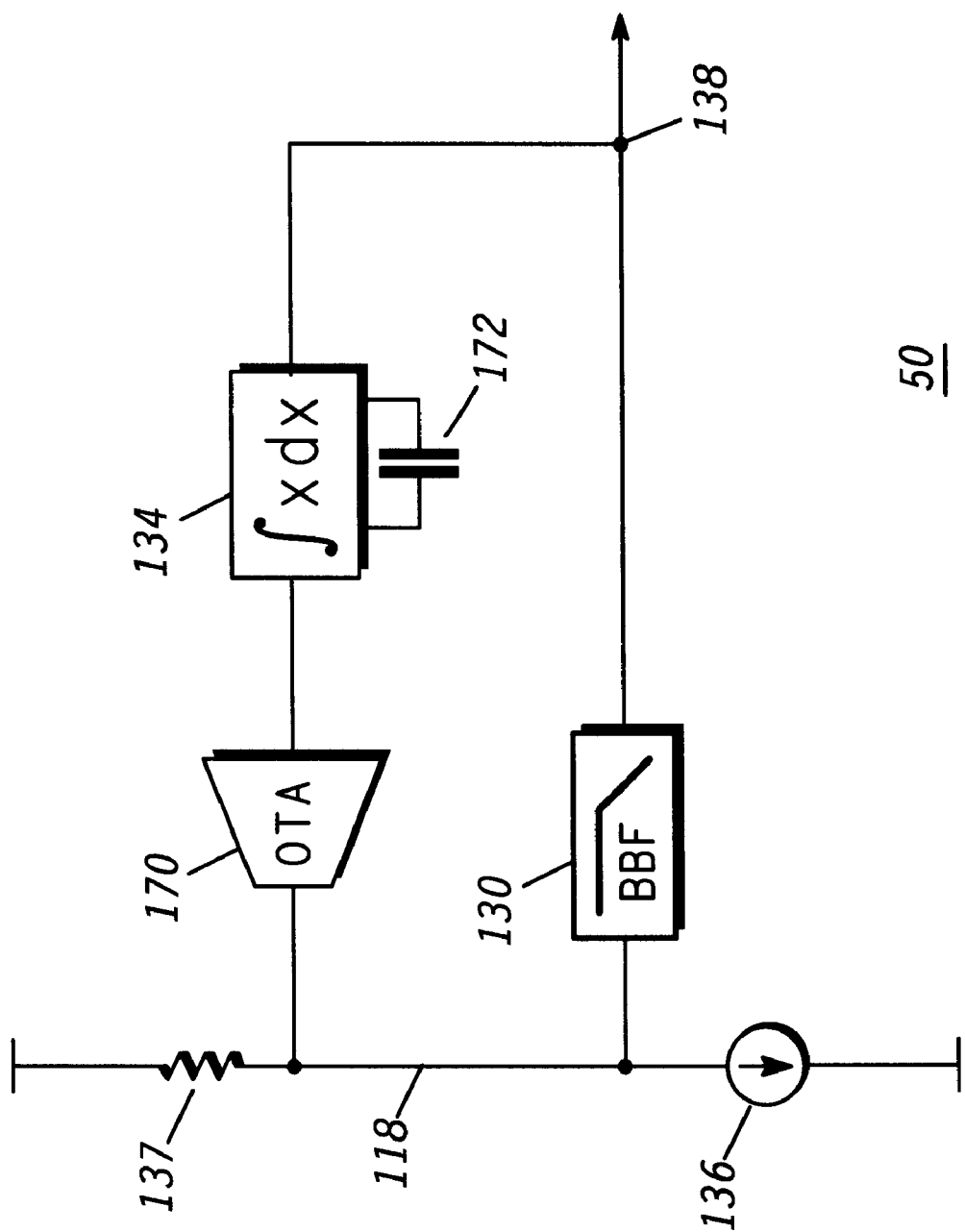
FIG. 1 is a block diagram of a DC offset correction loop using an analog integration scheme for continuous correction, in accordance with the preferred embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Briefly, the DC offset correction loop of the present invention incorporates a plurality of offset correction arrangements, which can be selected according to the particular application. Three exemplary arrangements are described below, but this is not to be considered limiting. Other DC offset correction arrangements could be used or substituted without departing from embodiments of the present invention.

ANALOG INTEGRATION

Turning now to FIG. 1, an analog integration DC offset correction arrangement is shown. This diagram represents an analog DC offset correction loop 50 such as would be used around the baseband path of a direct conversion receiver or Zero IF receiver or transmitter of a radio, cell phone, or other communication device. Correction loop 50 is generally, but not necessarily, used for single ended applications and generally includes a baseband filter 130, an integrator 134 (such as an operational amplifier based RC integrator), an operational transconductance amplifier (OTA) 170, and a mixer whose output impedance and DC bias current are represented by a current source 136 and a resistor 137. The desired DC voltage at the output of the baseband filter 130 is analog ground (half supply), however, the interaction of the current source 136, resistor 137, and the input referred DC offset of the baseband filter 130 generates an undesired DC offset at the filter input 118. The DC offset at the input 118 of the baseband filter 130 is amplified through the baseband filter (which may include gain stages) and produces a large offset at the baseband filter output 138. The integrator 134 and OTA 170 provide a feedback path to alter the current through the resistor 137 to adjust the voltage presented to the input of the baseband filter 118, thereby reducing the input referred DC offset.

This arrangement has the advantage of simplicity and continuous correction of offset with changes in operational conditions. The characteristics of the correction can be adjusted with a capacitor 172 or resistor value to change the integration time constant. However, modern communications systems often require fast settling times. Even small DC offsets can saturate the baseband signal path including filter 130 causing all linear loop equations to be invalid making it very difficult to settle the loop quickly. Once the offset has been rapidly corrected, the correction loop is often required to move to a much lower corner frequency or opened completely. Making a transition from a very wide offset correction loop bandwidth to a very narrow bandwidth poses a problem due to the transient response produced when making such a large transition. Moreover, opening the loop in an analog DC offset loop may cause the correction voltage to drift from the desired value, due to leakage on the integrator's 134 capacitor 172. Nonetheless, for certain applications, the ability to use a simple analog correction loop for certain applications has advantages including the lack of digital noise inherent in typical digital correction techniques and the ability to correct the DC offset in the presence of incoming signals. This technique, however, also has the disadvantage of creating a very low frequency notch in the DC offset correction loop. This notch creates a high pass filter response which can basically track out very low frequency signals in the baseband signal path (for example, very low frequency data).

DIGITAL BINARY SEARCH

Figure 2:
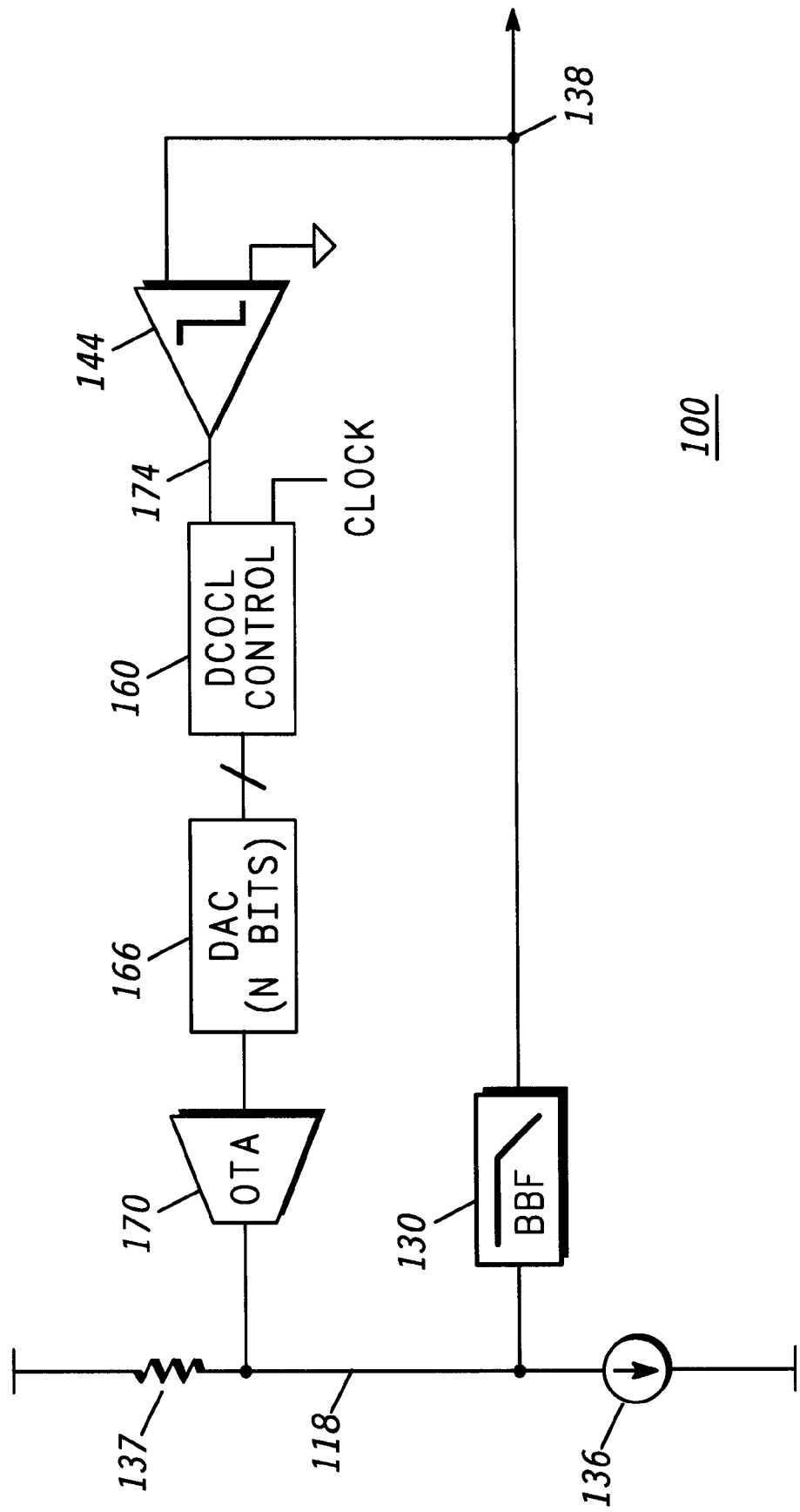
FIG. 2 is block diagram of a DC offset correction loop using a digital binary search arrangement, in accordance with the preferred embodiment of the present invention.

Turning now to FIG. 2, an embodiment of a DC offset correction loop using digital binary search is shown in a radio receiver embodiment, however, those having ordinary skill in the art will understand that the invention is equally applicable to radio transmitters and other electronic circuits. In a radio receiver embodiment of this invention, RF or IF input signals are received at a mixer which produces a mixer output at 118. This output is a baseband signal that is processed by various circuits including a baseband filter 130. At the output 138 of filter 130, the baseband signal, for example an I (in phase) or Q (quadrature) value in a digital radio receiver, is presented for processing. Those of ordinary skill in the art will recognize that I and Q may be represented by a differential pair of complimentary signals. Moreover, those of ordinary skill in the art will understand that for a system that uses the quadrature I and Q signals, a dual receiver path is normally present in the receiver. Only a single ended path for either the I or Q signal path of a radio receiver is shown in this document for simplicity. Those having ordinary skill in the art will understand that the signals may include a differential pair.

In order to carry out the digital binary searching DC offset loop correction of the present invention, only the sign of the DC offset is examined at 138. It is ultimately the DC offset at 138 which is to be corrected. The I or Q signal at 138 is applied to a comparator 144 (or other sign generator circuit) which generates a signal representing the sign (+ or –) of the signal at 138. The sign of the signal at 138 is applied to a DC Offset Correction Loop (DCOCL) control processor 160 which generates the binary search. Processor 160 may be realized as a separate hardware device such as a Digital Signal Processor or microcontroller or custom circuit, or may be embodied in a control microprocessor that exercises overall control over the radio receiver. The control processor 160 implements a binary search routine, as will be described shortly, and instructs the Digital to Analog Converter (DAC) 166 to produce and hold a desired analog voltage output.

This analog voltage output is applied as a step change in voltage to an Operational Transconductance Amplifier 170 which drives node 118 to a DC level which ultimately compensates for the error in DC offset in the system.

In accordance with the present invention, a binary search routine is executed by the DCOCL control processor 160 as follows. No input signal should be present at 118. A DC offset will typically appear at 138 for which a correction is desired. The condition of no input signal in a radio receiver can be achieved by, for example, disabling the preceding amplifier circuits, sharply attenuating the input signal path, or equivalently, the local injection oscillator can be disabled to produce no local oscillator injection signal to the mixer. Other techniques can also be used. In any case, only the DC offset should be present at 118.

The DC offset at 138, after processing by filter 130 (which may include gain stages) is fed back to the comparator 144 which serves as a sign bit generator to generate a signal representative of whether the signal at 138 is greater than or less than an ideal reference value. In accordance with the exemplary present embodiment of the binary search, the sign bit is used as an input to the DCOCL control processor 160 to determine which direction to move the offset correction. The DCOCL control processor 160 takes the sign information and produces a bit string to set the DAC 166 to a specified output voltage. Each time the DAC 166 input is changed during the binary search, a new correction voltage is generated which is used to further correct the DC offset present at the mixer output 118.

In accordance with the present embodiment of the binary search, the only information being fed back to the DCOCL control processor 160 is the direction with which to correct the DC offset. The DCOCL control processor uses the sign information to step the DAC 166 through a binary search of DAC settings, taking one step for each adjusted DC offset, until the DAC 166 has been stepped to change only its least significant bit, thereby providing a final correction voltage. Thus, the offset correction loop is able to determine an appropriate DAC setting in the minimum amount of time.

For a binary search algorithm, operation preferably begins at a predetermined DAC setting of $2^N/2$, where N represents the number of bits. The direction of each DAC step is based on the sign information. The initial step of the DAC 166 will be $2^N/2^2$. The steps will then become incrementally smaller each time according to the pattern $2^N/2^2$, $2^N/2^3$, $2^N/2^4$... $2^N/2^N$. When the DAC 166 steps $2^N/2^N$, the least significant bit (LSB) will have been adjusted, and the search is complete. For some applications, other start points may be desired. The DCOCL control processor 160 steps the DAC 166 up or down using incrementally smaller steps until the LSB is achieved. For each transition coming through the DAC 166, the bit settings change and this change in bit settings changes the output of the DAC 166. The changes in the output of the DAC 166 (through OTA 170) are summed at node 118 to achieve the offset correction. Each change in the output of DAC 166 in effect applies a step change in DC voltage to 118. After the transient response of the filter 130 decays adequately (to an insignificant contribution), the sign information is determined from comparator 144. The DC offset is adjusted through each step, which in turn potentially modifies the sign information as the process proceeds. Once the final step has been reached after N-1 steps or clock cycles, the DAC 166 setting is held constant until another correction sequence is initiated.

Increased precision may be obtained through the use of additional DACs and OTAs to provide greater precision in the offset voltage correction. Alternatively, DACs with greater range of precision can be used to effect higher precision correction if desired. In one technique, as described in the related application Ser. No. 09/290,564, a coarse tuning DAC with 6 bits is used to provide a coarse level of DC offset correction while a fine tuning DAC provides 7 bits of fine DC offset correction. In this example, the total resolution achieved is 13 bits, however, it should be noted that each of the DACs is stepped through the correction process independently. So, the offset correction is achieved in:

(6−1)+(7−1)=11 steps or clock cycles.

The binary search method provides for very rapid convergence of the DC offset correction loop to a final value. Various enhancements to this process are possible and are disclosed in co-pending patent applications. The present invention contemplates enhanced versions of the basic binary search as alternative embodiments as well, such as that disclosed in the co-pending application filed concurrently herewith for Enhanced DC Offset Correction Through Bandwidth and Clock Speed Setting, Docket number CM03133J to Tilley et al. which is hereby incorporated by reference. In this co-pending application, the bandwidth of the baseband filter 130 is increased during the binary search so that the search can be clocked at a higher rate of speed to further speed up the DC offset correction process. Other enhancements to the basic binary search may also be possible without departing from the basic search technique for DC offset correction and such enhancements and modifications are intended to be embraced as equivalents by reference to binary search or enhanced binary search in this application.

The digital binary search technique and it's various enhancements have the advantage of providing very rapid convergence to a correct DC offset without the problem of creating a low frequency notch in the DC offset correction loop. However, the correction process must generally be carried out without any input signal or with the input disabled, making it unsuitable for some applications. Moreover, a second technique to maintain the DC offset correction is needed or else the offset correction process must be repeated to account for drifts in the DC offset.

DIGITAL SLOW AVERAGING

Figure 3:
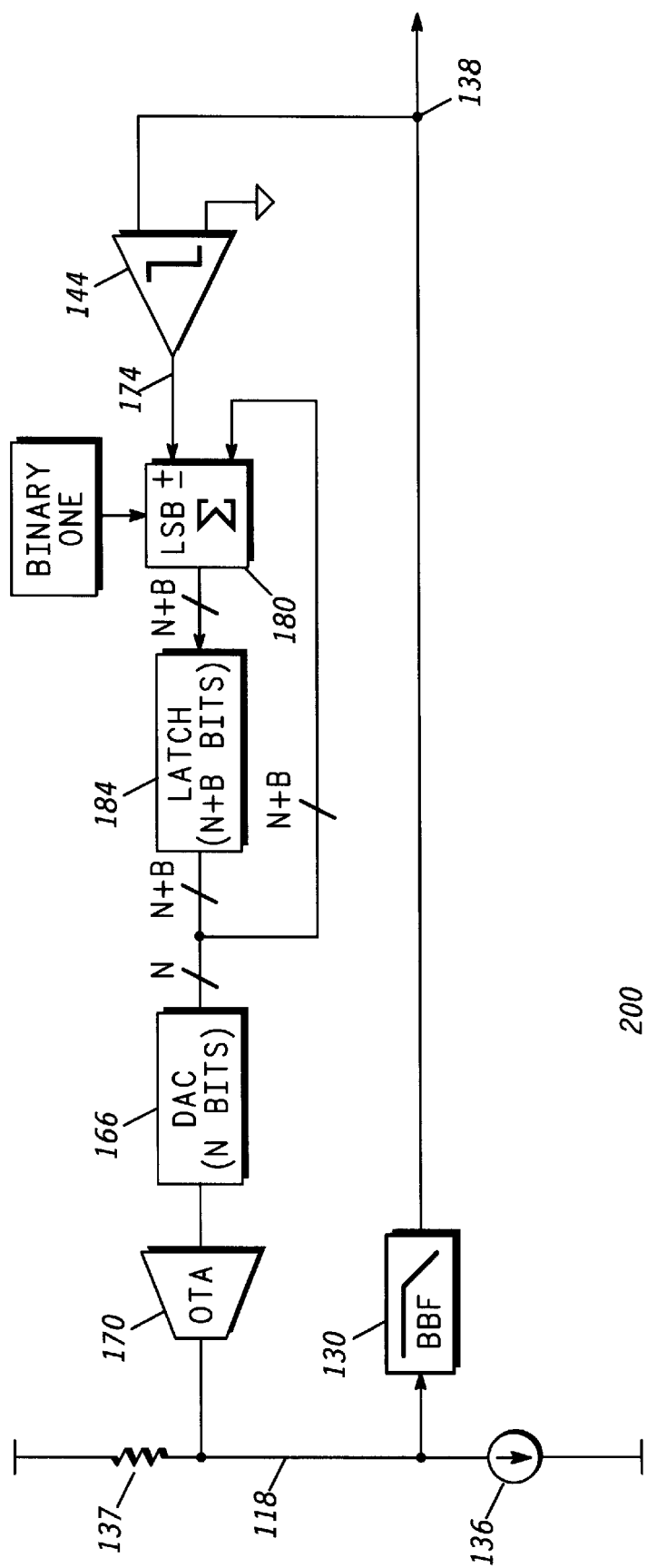
FIG. 3 is a block diagram of a DC offset correction loop using a digital slow averaging arrangement, in accordance with the preferred embodiment of the present invention.

Referring now to FIG. 3, a DC offset correction loop 200 using a digital slow averaging method is shown. In this loop 200, the comparator 144 is again used to determine a sign bit at 174 which represents whether the current DC offset at 138 is above or below an ideal reference. An adder 180 and a latch 184 are provided to perform a slow averaging function that drives the DAC 166.

The latch 184 holds the most recent N+B bit output of the adder 180 and that N+B bit output is fed back to the input of the adder 180. The N+B bit output is added in adder 180 with a binary 1 signal applied to the least significant bit position of the second input of the adder 180 (with zeros at the remaining positions). The sign bit from comparator 144 at output 174 determines whether the binary 1 is to be considered positive or negative. That is, the sign bit determines whether the binary 1 is added or subtracted from the most recent value latched into latch 184. The adder, operating in conjunction with the sign bit generator, thus either increments or decrements the value in the latch 184 on each cycle in accordance with whether the DC offset at 138 appears to be drifting higher or lower. With a signal present, any given sign bit may be in error, but over long periods of time, the average will either slowly increase or decrease in accordance with the drift of the DC offset at 138.

To avoid injection of noise into the system, it is not desirable to constantly dither the DC offset. Accordingly, only the N most significant bits from the latch 184 are used to drive the N bits of the DAC 166. In this manner, if for example there are 4 baffur bits (B) and N=8, then the 8 bits of the DAC 166 are controlled by the 8 most significant bits of the 12 bit latch 184. Thus, there are 16 steps of the least significant 4 bits of the 12 bit latch between changes in the least significant bit seen by the DAC 166. So, the latched value in latch 184 can increase or decrease by as much as 16 levels before the DAC's least significant bits are incremented or decremented by a single least significant bit. In this manner, the constant dither of the sign bit is eliminated and the averaging occurs at a very low rate with a very low corner frequency on the correction loop.

By coupling the most significant bits of the latch 184 to the DAC 166, the changes which occur with each successive measurement of the sign of the offset at 138 are ignored for purposes of changing the DAC 166 input. A change in the DAC 166 input will only occur after a number of + sign bits significantly outnumbers the number of − sign bits over a number of samples indicating that the DC offset has in fact drifted.

Those of ordinary skill in the art will understand that the embodiment of slow averaging just described can be readily implement in an integrated circuit, but many variations are possible. For example, the hardware described above can be readily implemented as an algorithm operating on a programmed processor. Numerous variations and enhancements will occur to those of ordinary skill in the art, and such variations and enhancements are contemplated by the present invention. This method for DC offset correction has the advantage of providing continuous DC offset correction, even in the presence of input signal. However, it suffers from the drawback of creating a notch in the DC baseband loop which might cause a tracking out of very low frequency data in a received signal.

MULTIPLE MODE DC OFFSET CORRECTION

Each of the techniques described above has advantages and disadvantages, some of which are outlined in Table 1 below:

TABLE 1

| OFFSET CORRECTION TECHNIQUE | ADVANTAGES | DISADVANTAGES |
|---|---|---|
| Analog integration | Simple to implement; Characteristics selectable by RC time constant; can be used with signal present; continuous DC offset correction | Usually slow; may require external components (size, pinout, cost disadvantage); programming may require component change; transients can occur when changing time constant; high pass response in DC offset correction loop |
| Digital binary search | Fast correction; no high pass response in DC offset correction loop | Requires turning off input signal; correction is not continuous - must be periodically re-corrected or otherwise maintained |
| Digital slow averaging | Can be used with signal present; fully programmable without | Usually slow; possible generation of small amounts of digital noise or dithering |

TABLE 1-continued

| OFFSET CORRECTION TECHNIQUE | ADVANTAGES | DISADVANTAGES |
|---|---|---|
| | component change; continuous DC offset correction. | of the correction; high pass response in DC offset correction loop |

It is therefore desirable to provide a method and apparatus according to the present invention in which multiple DC offset correction arrangements can be provide, preferably on a single integrated circuit, which can be selected by the user to effect whatever type of DC offset corrections is best suited to the application at hand.

Figure 4:
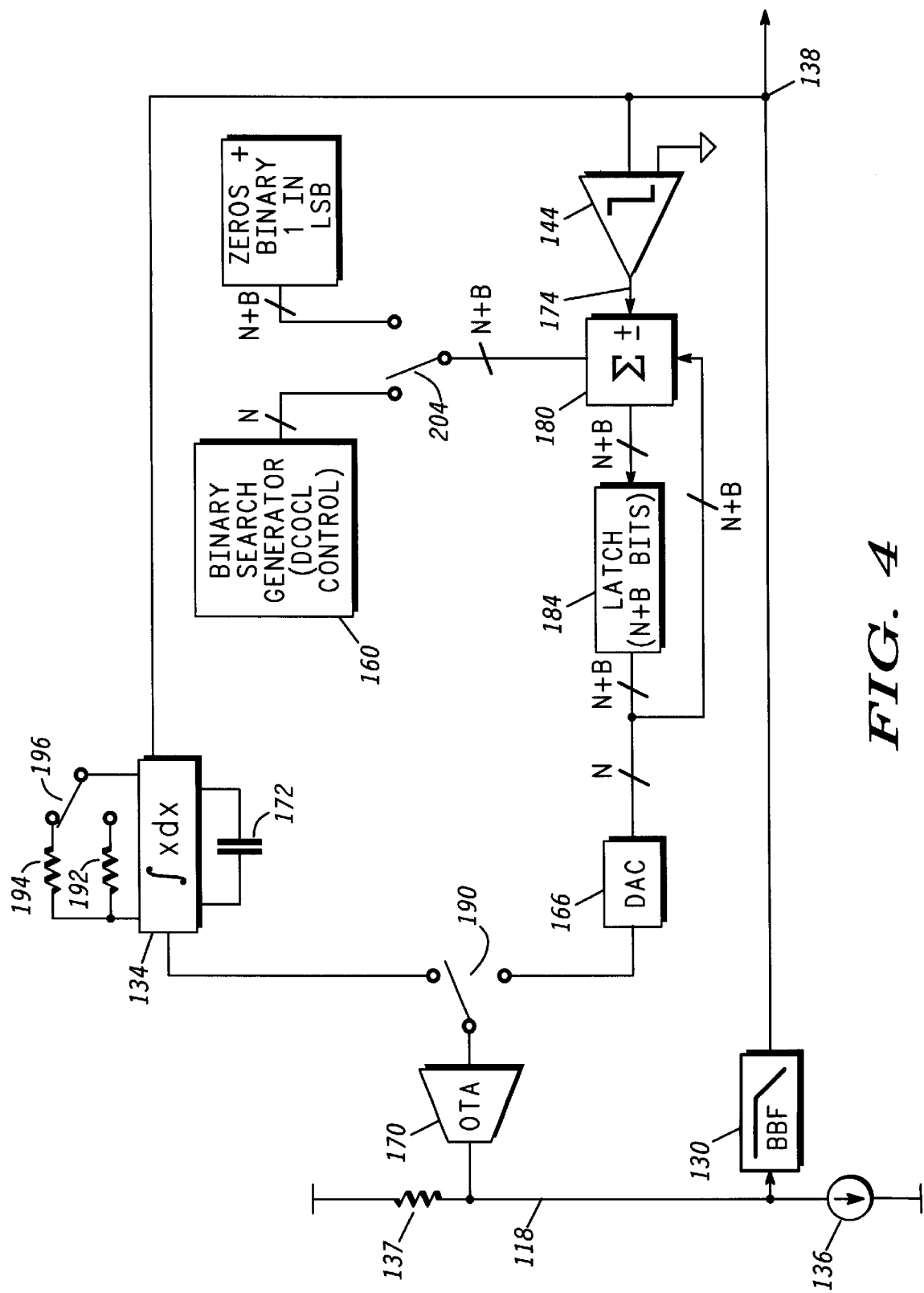
FIG. 4 is a block diagram of a DC offset correction arrangement which can utilize any of a plurality of offset correction schemes, in accordance with the preferred embodiment of the present invention.

FIG. 4 shows an embodiment of the invention in which all three of the above DC offset correction arrangements are integrated into a single system to permit the designer to selectively use one or more correction loops or processes as desired. Preferably, these three techniques and variations/enhancements thereof, are integrated into a single integrated circuit that can be applied to multiple applications to achieve various advantages (e.g. use of same circuit multiple radio receiver designs with varying requirements).

In FIG. 4, the baseband filter 130 is surrounded by a plurality of selectable correction circuits which can be utilized according to switched control or hard wired to operate in a desired mode. Analog integration can be selected by setting (by electronic control) switch 190 (or by hard wiring the appropriate connections) to the top position so that the offset form 138 is fed through the integrator 134. Integrator 134 drives the OTA 170 to effect correction at node 118 in the manner described in connection with FIG. 1. The remaining circuitry is not utilized for this mode. The R-C time constant can be selected, for example, by an external capacitor 172. In certain embodiments, one of several internal or external resistors such as resistors 192 and 194 can be selected (or combined in some manner—series or parallel) to produce selectable time constants as with switch 196. This can provide for rapid convergence to a correct DC offset using one time constant and a slower integration mode using a longer time constant to maintain the DC offset correction.

If digital slow averaging is desired, switch 190 is set to be in the lower position, connecting the output of DAC 166 to the OTA 170. The N most significant bits of latch 184 are connected to the input of DAC 166. Switch 204 is set to apply a 1 to the LSB and zeros to the remaining position of an input of the adder 180. In this mode of operation, the slow averaging feedback loop is connected so that the comparator 144 drives the +/− input of the adder 180. The adder 180 thus determines from the sign bit at 174 whether to add or subtract (i.e. twos complement add) a binary 1 in the least significant bit (and all others zero) to the contents of latch 184 to produce the next input for latch 184. As described in connection with FIG. 3, this produces a slow averaging accumulation effect so that a long sequence of mostly + or mostly − sign bits have to occur in order to move the LSB of DAC 166 up or down.

When the fast binary search mode is desired, switch 190 is set in the lower position again connecting DAC 166 with OTA 170. Then, most significant bits of latch 184 output are connected to the N bit DAC 166 input. Switch 204 is set to connect N bits of the binary search generator 160 (the DCOCL control circuit) to the N most significant bits of the adder 180. Binary search generator 160 selectively drives the adder 180 with the sequence of values described in connection with FIG. 2 to converge on a minimum offset value. This offset value is then held by latch 184.

In certain embodiments, it is advantageous to use a combination of the techniques described above to achieve optimum DC offset. For example, the binary search process can be used to quickly converge on a minimum DC offset. Then, switch 204 can be switched to change to the slow averaging mode to provide continuous compensation for changes in operating conditions (e.g. temperature changes and the like). Or, the DC offset correction mode can be tied to the operational mode of the device. In the case of a multi-mode transceiver having GSM plus a continuous transmission mode (not time division multiplexed), a binary search might be used for the GSM mode while analog integration might be used for the continuous transmission mode. Other advantageous combinations will occur to those having ordinary skill in the art.

Those of ordinary skill in the art will recognize that the present invention has been described in terms of exemplary embodiments based upon use of a programmed processor forming a part of the DC offset correction loop. However, the invention should not be so limited, since the present invention could be implemented using hardware component equivalents such as special purpose hardware and/or dedicated processors, which are equivalents to the invention as, described and claimed. Similarly, general purpose computers, microprocessor based computers, digital signal processors, micro-controllers, dedicated processors, ASICS and/or dedicated hard wired logic may be used to construct alternative equivalent embodiments of the present invention. In general, it is advisable that the processing resources available within the device having DC offset correction be used to the extent possible. For example, in the case of a radio receiver or transmitter, often a control processor carries out many of the functions associated with control of the device. This control processor can be utilized to serve as the DC offset correction loop control processor.

Many other variations will also be evident to those of ordinary skill in the art. For example, the comparator 144 is used to determine the sign of the offset in the present invention, but other devices may equally well be used. Such devices include limiters, operational amplifier circuits and analog to digital converters. The embodiment disclosed is embodied in a radio receiver, however, the method and apparatus is equally applicable to other systems requiring DC offset correction including radio transmitters. In embodiments of the slow averaging, the latch and adder may be implemented as software rather than hardware devices. Moreover, while the embodiment of FIG. 4 illustrates three basic operational modes which can be selected by switches (mechanical, semiconductor or software), certain applications may require only one mode which can be permanently coupled. Other embodiments may require two modes which can be switch or program selectable. Still other embodiments may use all three basic modes of correction or may add a fourth mode or enhancements of one or more of the three basic operational modes. Such variations are contemplated by the present invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for correcting a DC offset in an electronic circuit, comprising:
providing a first DC offset correction arrangement selectively coupled to the electronic circuit;
providing a second DC offset correction arrangement selectively coupled to the electronic circuit; and
selecting one of the first and second DC offset correction arrangements for correcting DC offset in the electronic circuit.

2. A method in accordance with claim 1, wherein the first DC offset correction arrangement comprises a digital binary search DC offset correction circuit.

3. A method in accordance with claim 1, wherein the second DC offset correction arrangement comprises a digital slow averaging DC offset correction circuit.

4. A method in accordance with claim 1, wherein the second DC offset correction arrangement comprises an analog integration DC offset correction circuit.

5. A method in accordance with claim 1, further comprising providing a third DC offset correction arrangement selectively coupled to the electronic circuit; and wherein the selecting comprises selecting one of the first, second and third DC offset correction arrangements for correcting DC offset in the electronic circuit.

6. A method in accordance with claim 5, wherein the first DC offset correction arrangement comprises a digital binary search DC offset correction circuit, the second DC offset correction arrangement comprises a digital slow averaging DC offset correction circuit, and the third DC offset correction arrangement comprises an analog integration DC offset correction circuit.

7. A method in accordance with claim 2, wherein the digital binary search DC offset correction circuit comprises an enhanced digital binary search DC offset correction circuit.

8. A method in accordance with claim 6, carried out in one of a radio transmitter and a radio receiver.

9. A method in accordance with claim 1, wherein the selecting comprises first selecting the first DC offset correction arrangement and next selecting the second DC offset correction arrangement, wherein the first DC offset correction arrangement has a fast DC offset correction characteristic and wherein the second DC offset correction arrangement has a slow continuous DC offset correction characteristic.

10. A DC offset correction circuit, comprising:
a signal path, the signal path having a baseband filter, an input and an output;
a first DC offset correction feedback circuit selectively coupled to the signal path and operating in a first mode, which receives the signal path output and applies a DC offset correction voltage to the input of the signal path;
a second DC offset correction feedback circuit selectively coupled to the signal path and operating in a second mode, which receives the signal path output and applies a DC offset correction voltage to the input of the signal path; and
a controller which selects one of the first and the second DC offset correction feedback circuits for coupling to the signal path.

11. A circuit in accordance with claim 10, wherein the first DC offset correction feedback circuit comprises a digital binary search DC offset correction.

12. A circuit in accordance with claim 10, wherein the second DC offset correction feedback circuit comprises a digital slow averaging DC offset correction.

13. A circuit in accordance with claim 10, wherein the second DC offset correction feedback circuit comprises an analog integration DC offset correction circuit.

14. A circuit in accordance with claim 10, further comprising a third DC offset correction feedback circuit selectively coupled to the signal path and operating in a third mode, which receives the signal path output and applies a selected DC offset correction voltage to the input of the signal path; and wherein the controller selects one of the first, second and third DC offset correction feedback circuits for coupling to the signal path.

15. A circuit in accordance with claim 14, wherein the first DC offset correction circuit comprises a digital binary search DC offset correction circuit, the second DC offset correction feedback circuit comprises a digital slow averaging DC offset correction circuit, and the third DC offset correction feedback circuit comprises an analog integration DC offset correction circuit.

16. A circuit in accordance with claim 13, wherein the analog integration DC offset correction circuit further comprises a resistor and a capacitor which determine an integration time constant.

17. A circuit in accordance with claim 16, wherein the controller further selects from among a plurality of resistor and capacitor combinations to establish one of a plurality of integration time constants.

18. A circuit in accordance with claim 10, wherein the controller first selects a DC offset feedback circuit having a fast correction characteristic and subsequently selects a DC offset feedback circuit having a continuous slow correction characteristic.

19. A circuit in accordance with claim 10, wherein the first and second DC offset feedback circuits are integrated into an integrated circuit.

20. A communication device, comprising:
a DC offset correction path, comprising:
a signal path, the signal path having a baseband filter, an input and an output;
a first DC offset correction feedback circuit selectively coupled to the signal path and operating in a first mode, which receives the signal path output and applies a DC offset correction voltage to the input of the signal path;
a second DC offset correction feedback circuit selectively coupled to the signal path and operating in a second mode, which receives the signal path output and applies a DC offset correction voltage to the input of the signal path; and
a controller which selects one of the first and the second DC offset correction feedback circuits for coupling to the signal path.

* * * * *